United States Patent
Ko (10) Patent No.: US 9,157,798 B2
(45) Date of Patent: Oct. 13, 2015

(54) OPTICAL WAVELENGTH DISPERSION DEVICE AND METHOD OF MANUFACTURING THE SAME

(75) Inventor: Cheng-Hao Ko, Hsinchu County (TW)

(73) Assignee: PHOTON CHIP, INC., County of New Castle, DE (US)

( * ) Notice: Subject to any disclaimer, the term of this patent is extended or adjusted under 35 U.S.C. 154(b) by 530 days.

(21) Appl. No.: 13/556,154

(22) Filed: Jul. 23, 2012

(65) Prior Publication Data
US 2013/0114928 A1    May 9, 2013

Related U.S. Application Data

(60) Provisional application No. 61/557,387, filed on Nov. 8, 2011.

(51) Int. Cl.
| | |
|---|---|
| G02B 6/25 | (2006.01) |
| G01J 3/04 | (2006.01) |
| G02B 6/12 | (2006.01) |
| G02B 6/138 | (2006.01) |
| G02B 6/293 | (2006.01) |
| G03F 7/00 | (2006.01) |
| G03F 7/20 | (2006.01) |
| G01J 3/02 | (2006.01) |
| G03F 7/16 | (2006.01) |
| G03F 7/30 | (2006.01) |

(52) U.S. Cl.
CPC .... *G01J 3/04* (2013.01); *G01J 3/02* (2013.01); *G02B 6/12007* (2013.01); *G02B 6/138* (2013.01); *G02B 6/29307* (2013.01); *G02B 6/29308* (2013.01); *G03F 7/0005* (2013.01); *G03F 7/16* (2013.01); *G03F 7/201* (2013.01); *G03F 7/2002* (2013.01); *G03F 7/203* (2013.01); *G03F 7/2024* (2013.01); *G03F 7/30* (2013.01); *G02B 6/2931* (2013.01); *G02B 2006/12107* (2013.01); *G03F 7/2039* (2013.01)

(58) Field of Classification Search
CPC ...................................................... G02B 6/0808
See application file for complete search history.

(56) References Cited

U.S. PATENT DOCUMENTS 5,734,165 A * 3/1998 Unal et al. ............... 250/338.1

* cited by examiner

*Primary Examiner* — Jerry Rahll
(74) *Attorney, Agent, or Firm* — Raymond Y. Chan; David and Raymond Patent Firm (57) ABSTRACT

An optical wavelength dispersion device includes a first substrate, an input unit formed on the first substrate having a slit for receiving an optical signal, a grating formed on the first substrate for producing a first light beam form the optical signal for outputting, and a second substrate covered on the top of the input unit and the grating, wherein the input unit and the grating are formed from a photo-resist layer by high energy light source exposure.

7 Claims, 8 Drawing Sheets

OPTICAL WAVELENGTH DISPERSION DEVICE AND METHOD OF MANUFACTURING THE SAME

CROSS REFERENCE OF RELATED APPLICATION

This is a non-provisional application that claims the benefit of priority under 35 U.S.C. §119 to a provisional application, application No. 61/557,387, filed Nov. 8, 2011.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

1. Field of Invention

The present invention generally relates to a wavelength dispersion device, more particularly to an optical wavelength dispersion device in a SoC (system on chip) for reducing the size and cost of the device.

2. Description of Related Arts

Optical communication is any form of telecommunication that uses light as the transmission medium. An optical communication system consists of a transmitter, which encodes a message into an optical signal, a channel, which carries the signal to its destination, and a receiver, which reproduces the message from the received optical signal. The receiver comprises an input slit for receiving the optical signal, and a grating for splitting and diffracting the optical signal in different directions for outputting. In other optical applications, such as spectrometers or optical analyzers, the grating plays an important role in the applications.

By far, leading technology for manufacturing MEMS devices is Si-micromachining and its various derivatives. However, many applications of microsystems have requirements on materials basis, geometry, aspect ratio, dimensions, shape, accuracy of microstructures, and number of parts that cannot be fulfilled easily by mainstream silicon-based micromachining technologies. LIGA, an alternative microfabrication process combining lithography, electro-plating and molding, enables the high precision manufacture of microstructures with large structural height ranging from hundreds to thousands of micrometers thick. The yield of de-molding process in LIGA is not high enough for fabricating vertical grating due to the small pitches of grating structure.

U.S. Pat. No. 7,034,935 discloses a high performance miniature spectrometer with a detector array optically coupled to a slab waveguide structure, and a focal plane provided outside of the output face of the slab waveguide structure. The detector array is mounted onto the slab waveguide structure at a fixed distance from the output face on the output focal plane. Obviously, the size of the spectrometer in the U.S. Pat. No. 7,034,935 is not effective because the structure of the spectrometer is assembled by a plurality of elements.

U.S. Pat. No. 7,485,869 discloses an optical spectroscopy tool performed in the vacuum ultraviolet (VUV) region. However, the size of the spectroscopy in U.S. Pat. No. 7,485,869 is not effective because the structure of the spectroscopy is assembled by a plurality of elements.

U.S. Patent Application publication no. 2010053611 discloses a diffraction grating structure having ultra-high density of grooves, which comprises an echellette substrate having periodically repeating recessed features, and a multi-layer stack of materials disposed on the echellette substrate. The diffraction grating is formed by semiconductor processes. However, it is not a SoC structure.

According to the drawbacks aforementioned, the present invention provides an optical wavelength dispersion device and method of manufacturing the same for reducing the size and cost of the device.

SUMMARY OF THE PRESENT INVENTION

An objective of the present invention is to provide an optical wavelength dispersion device with small size and lower cost.

Another objective of the present invention is to provide an optical wavelength dispersion device in a SoC (system on chip) by high energy light source exposure.

For achieving the above objectives, the present invention provides an optical wavelength dispersion device, comprising:

a first substrate;

an input unit formed on the first substrate having a slit for receiving an optical signal;

a grating formed on the first substrate for producing a first light beam form the optical signal for outputting; and a second substrate covered on the top of the input unit and the grating; wherein the input unit and the grating are formed from a photo-resist layer by a high energy light source exposure; wherein the wavelength of the high energy light source is from 0.01 to 100 nm.

According to the optical wavelength dispersion device aforementioned, wherein the high energy light source is selected from X-ray, soft X-ray or EUV.

According to the optical wavelength dispersion device aforementioned, wherein the width of the slit is from 5 to 500 μm.

According to the optical wavelength dispersion device aforementioned, wherein the grating has a concave, convex or planar profile with pitches of laminar type, saw-tooth type, blaze type, sinusoidal type or a combination of those types.

According to the optical wavelength dispersion device aforementioned, wherein the first substrate and the second substrate are semiconductor substrates, glass substrates, metal substrates or plastic substrates.

According to the optical wavelength dispersion device aforementioned, further comprising an optical reflector formed on the first substrate for reflecting the first light beam from the grating.

According to the optical wavelength dispersion device aforementioned, wherein the optical reflector is formed from the photo-resist layer by the high energy light source exposure.

Another embodiment of the present invention provides a method of manufacturing an optical wavelength dispersion device, comprising the following steps:

(a) providing a first substrate;

(b) forming a photo-resist layer on the first substrate;

(c) exposing the photo-resist layer by high energy light source through a high-energy-light-source mask, wherein the wavelength of the high energy light source is from 0.01 to 100 nm;

(d) developing the photo-resist layer for forming an input unit with a slit and a grating;

(e) coating a reflective layer on the surface of the first substrate, the input unit and the grating; and (f) covering a second substrate on the top of the input unit and the grating.

According to the method of manufacturing an optical wavelength dispersion device aforementioned, the high energy light source is selected from X-ray, soft X-ray or EUV.

According to the method of manufacturing an optical wavelength dispersion device aforementioned, the width of the slit is from 5 to 500 μm.

According to the method of manufacturing an optical wavelength dispersion device aforementioned, the grating has a concave, convex or planar profile with pitches of laminar type, saw-tooth type, blaze type, sinusoidal type or a combination of those types.

According to the method of manufacturing an optical wavelength dispersion device aforementioned, the first substrate and the second substrate are semiconductor substrates, glass substrates, metal substrates or plastic substrates.

According to the method of manufacturing an optical wavelength dispersion device aforementioned, the thickness of the photo-resist layer is from 10 to 1000 μm.

According to the method of manufacturing an optical wavelength dispersion device aforementioned, the high energy light source mask comprises a third substrate, a metal layer formed on the third substrate, metal patterns formed on the top of the metal layer and a silicon layer formed on the bottom of the third substrate.

According to the method of manufacturing an optical wavelength dispersion device aforementioned, the material of the third substrate is Si3N4 or SiC and the thickness of the third substrate is from 1 to 5 μm.

According to the method of manufacturing an optical wavelength dispersion device aforementioned, the metal layer is a Ti layer with thickness from 10 to 200 nm and the metal patterns are Au patterns with a thickness from 1 to 10 μm.

According to the method of manufacturing an optical wavelength dispersion device aforementioned, after the step (c), the method further comprises the step of rotating the high energy light source mask together with the first substrate by a specified angle with respect to the beam direction of the high energy light source to form an optical reflector by a second time high energy light source exposure.

According to the method of manufacturing an optical wavelength dispersion device aforementioned, after the step (c), the method further comprises the step of providing an optical reflector formed by a second time high energy light source exposure through a photo-mask with a specified angle rotation opposite to the first substrate.

According to the method of manufacturing an optical wavelength dispersion device aforementioned, the method further comprises the step of hard baking the input unit, the grating and the optical reflector with temperature from 100 to 200° C.

According to the method of manufacturing an optical wavelength dispersion device aforementioned, the method further comprises the step of coating a high reflectivity coating layer on the surface of the first substrate, the input unit, the grating and the optical reflector.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits, and advantages of the preferred embodiments of the present invention will be readily understood by the accompanying drawings and detailed descriptions, wherein.

DETAILED DESCRIPTION OF THE PREFERRED EMBODIMENT

For optical communication devices, basic elements, such as gratings, can be made from silicon wafer but some can not. Therefore, it is desirable to provide a method for fabricating the all elements of optical communication devices by lithographic manufacturing processes.

Figure 1A:
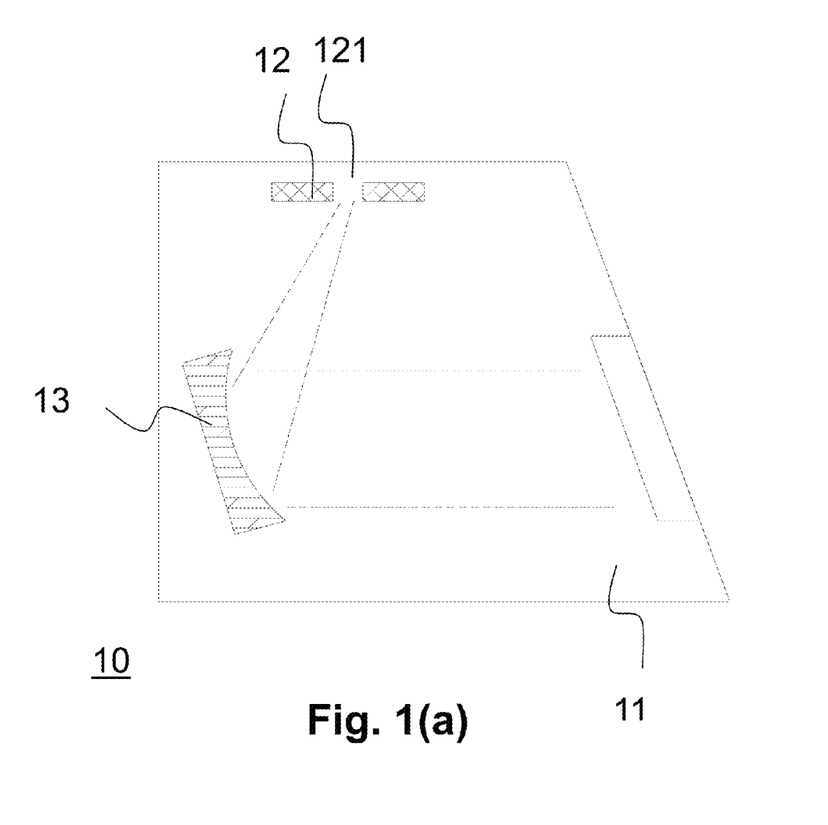
FIGS. 1(a) and 1(b) illustrate hint diagrams of the optical wavelength dispersion device of the present invention.

Referring to FIG. 1, FIG. 1(a) illustrates a hint diagram of the optical wavelength dispersion device of the present invention. The optical wavelength dispersion device 10 comprises a first substrate 11, an input unit 12 having a slit 121, a grating 13, an output unit (not shown) and a second substrate (not shown). The input unit 12 is formed on the first substrate 11 for receiving an optical signal through the slit 121. The width of the slit is about 5~500 μm. The grating 13 is formed on the first substrate 11 for producing a first light beam (dispersed focused light beam) from the optical signal to the output unit (not shown). The grating 13 has a concave, convex or planar profile with pitches of laminar type, saw-tooth type, blaze type, sinusoidal type or a combination of those types. Generally speaking, the optical signals of different wavelength are focused at different locations on the output unit. The grating 13 is blazed to increase the diffraction efficiency of the specified diffraction order. The wavelength of the optical signals is adaptable from 200 to 2000 nm. The output unit (not shown) is used for outputting the first light beam (dispersed focused light beam) from the grating 13. The external sensor (not shown) receives the first light beam from the grating 13 for afterward processing. The second substrate (not shown) is covered on the top of the input unit 12 and the grating 13. Therefore, the space between the first substrate 11 and the second substrate (not shown) works as an optical waveguide for receiving and transmitting optical signals.

Moreover, the input unit 12 and the grating 13 are formed from a photo-resist layer by a high energy light source exposure. The high energy light source can be X-ray, soft X-ray or EUV (extreme UV). The wavelength of X-ray is from 0.01 to 1 nm, the wavelength of soft X-ray is from 0.1 to 10 nm, and the wavelength of EUV is from 10 to 120 nm. Due to the surface roughness limitation in optical telecommunications and local optical communications, the wavelength with 0.1 to 1 nm of the high energy light source is better than that with 1 to 100 nm. The first substrate 11 and the second substrate 15 are semiconductor substrates, glass substrates, metal substrates or plastic substrates.

Figure 1B:
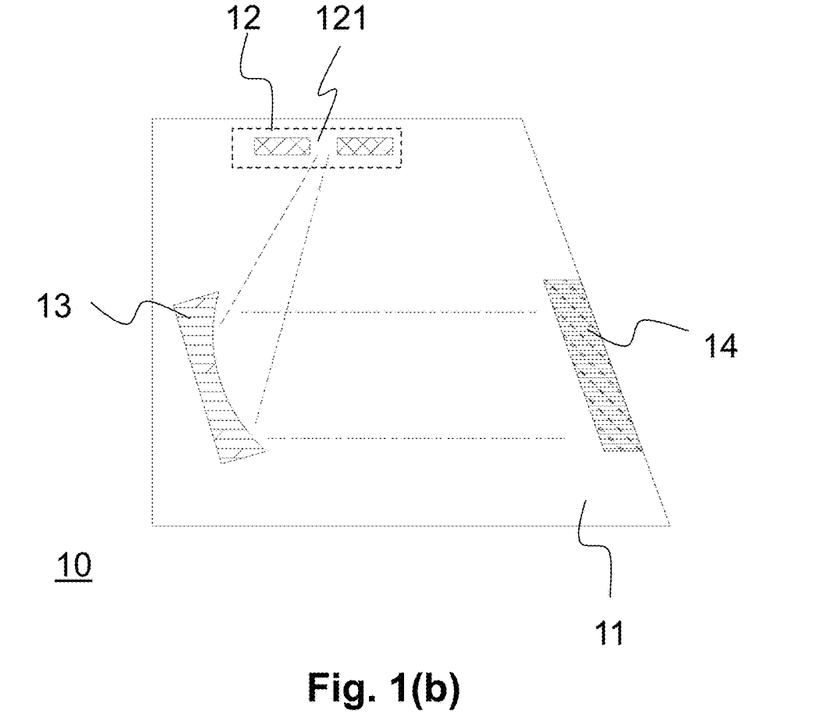

In FIG. 1(b), the optical wavelength dispersion device 10 further comprises an optical reflector 14 formed on the first substrate 11 for reflecting the first light beam from the grating 13. Thus, the external sensor (not shown) can be positioned in any direction (especially in upper or lower side) near the optical wavelength dispersion device 10 according to the user's designation. Also, the optical reflector 14 is formed from the photo-resist layer by high energy light source exposure.

Figure 2A:
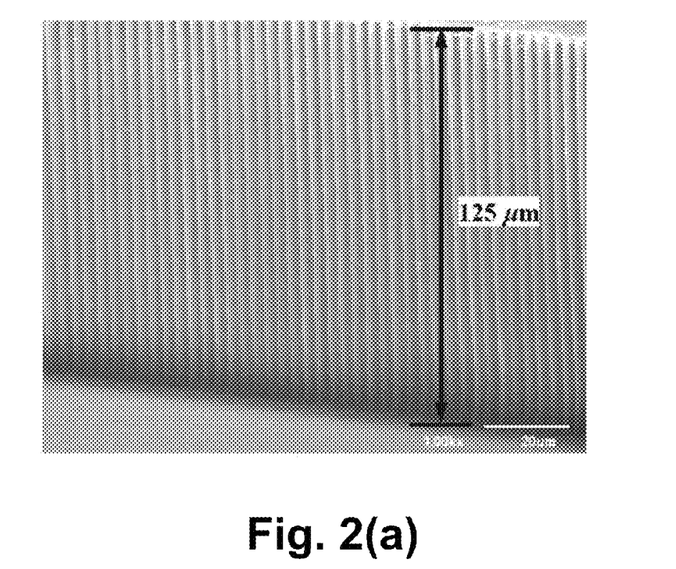
FIG. 2(a) and FIG. 2(b) illustrate the top view and lateral view of the grating in FIGS. 1(a) and 1(b) respectively.
Figure 2B:
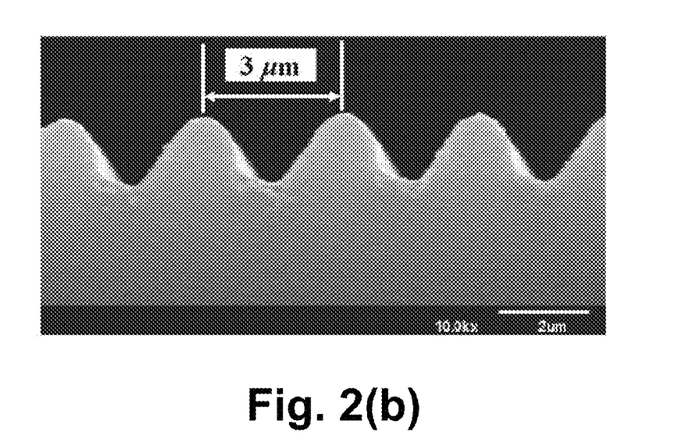
Figure 3:
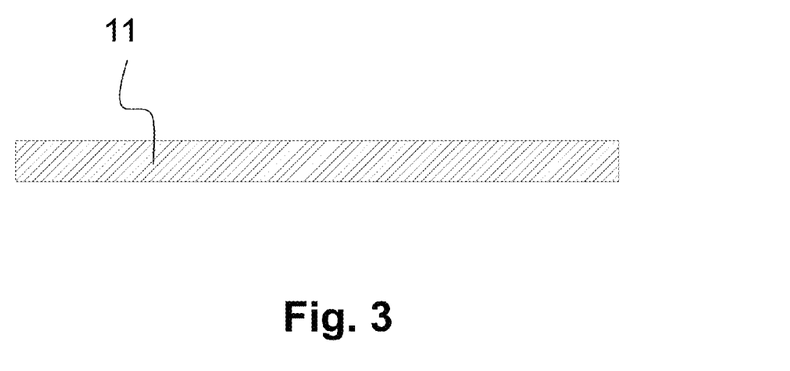
FIG. 3 to FIG. 9 illustrate processes for manufacturing the optical wavelength dispersion device of the present invention.
Figure 4:
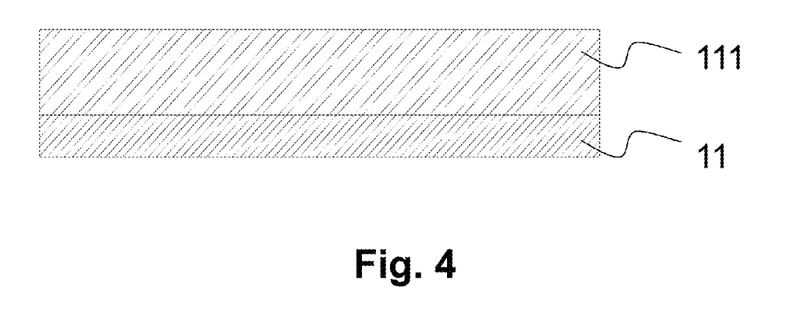
Figure 5:
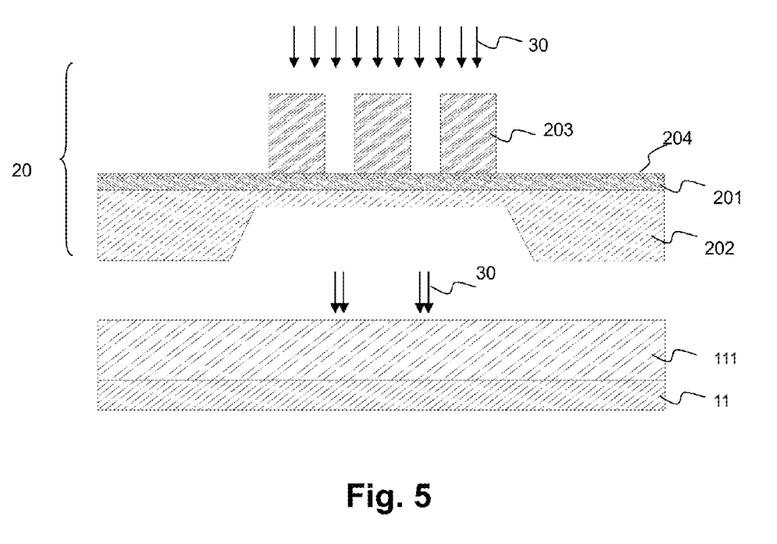
Figure 6:
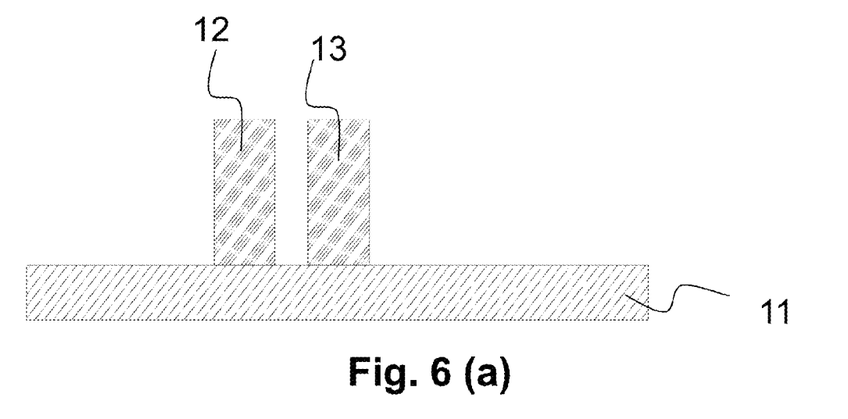
Figure 6B:
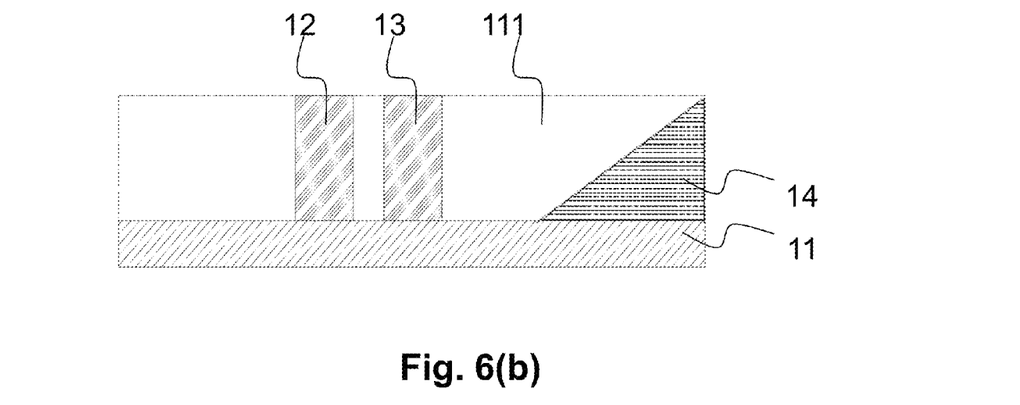
Figure 7:
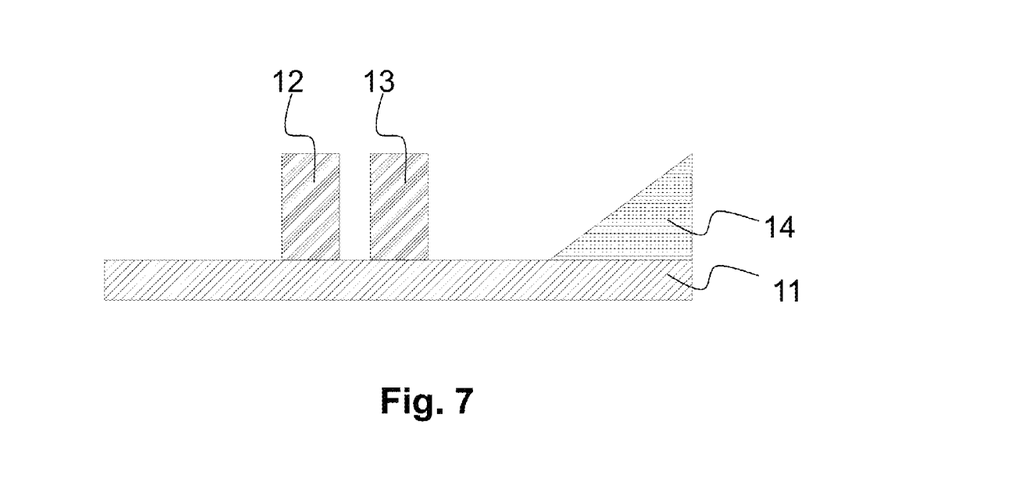

FIG. 2(a) and FIG. 2(b) illustrate the top view and lateral view of the grating 13 in FIGS. 1(a) and 1(b) respectively. After the high energy light source exposure, the pitch between adjacent peaks of the grating is about 3 μm and the surface roughness of the grating is about 5~10 nm. Thus, the grating is suitable for using in both optical telecommunications and local optical communications.

FIG. 3 to FIG. 9 illustrate the processes for manufacturing the optical wavelength dispersion device of the present invention. As shown, for manufacturing the optical dispersion device, first, a first substrate 11 is provided and a photo-resist layer 111 with thickness about 10~1000 μm is formed on the first substrate. All components of the optical wavelength dispersion device will be formed from the photo-resist layer 111, and the material of the photo-resist layer 111 is, for example, SU-8 or PMMA. Then, the photo-resist layer 111 is exposed by high energy light source 30, such as X-ray, soft X-ray or EUV (extreme UV), through an high energy light source mask 20. The high energy light source mask 20 comprises a substrate 201 (Si3N4 or SiC) with thickness about 1~5 μm, a Ti layer 204 with thickness about 10~200 nm formed on the substrate 201, Au patterns 203 formed on the top of the Ti layer 204 and a silicon layer 202 formed on the bottom of the substrate 201. A part of high energy light source 30 is blocked by the Au patterns 203 with thickness about 1 to 10 μm, and the Au patterns 203 in the high energy light source mask 20 are transferred to the photo-resist layer 111 through a high energy light source exposure.

After the high energy light source exposure (for example), the photo-resist layer 111 with high energy light source exposure area is developed. After developing, the exposed area of the photo-resist layer 111 forms an input unit 12 with a slit 121 (shown in FIG. 1) and a grating 13. Furthermore, an optical reflector 14 is formed by a second time high energy light source exposure through the high energy light source mask 20 with a specified angle rotation (for example, 45 degrees) before developing. Or the optical reflector 14 is formed by a second time high energy light source exposure with a photo-mask. Also, the high energy light source mask 20 together with the fist substrate 11 (shown in FIG. 4) should be rotated at a particular angle (for example, 45 degree) during exposure. Or, the photo mask is rotated with a specified angle opposite to the first substrate during the second exposure for forming the second optical reflector. The photo mask could be the original mask or another mask. For increasing the strength of the input unit 12, the grating 13 and the optical reflector 14, the input unit 12, the grating 13 and the optical reflector 14 are hard baked with temperature from 100 to 200° C.

Figure 8:
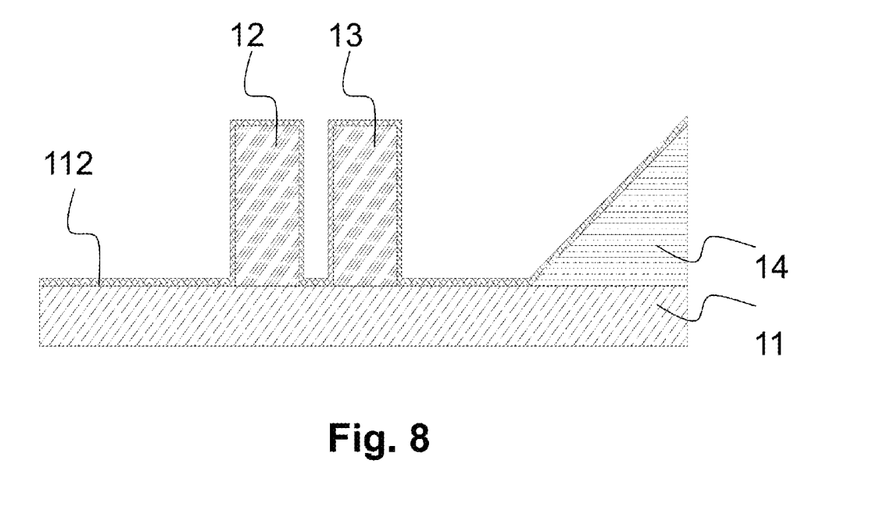

Referring to FIG. 8, for increasing the reflectivity of the first substrate 11, the input unit 12, the grating 13 and the optical reflector 14, a high reflectivity coating layer (Au or Al) 112 is then coated on the surface of the first substrate 11, the input unit 12, the grating 13 and the optical reflector 14. Finally, a second substrate 15 with high reflectivity coating layer (Au or Al) 112 is covered on the top of the input unit 12 and the grating 13. Therefore, referring to FIG. 9, the space between the first substrate 11 and the second substrate 15 works as an optical waveguide for the propagation of the optical signals from the input unit 12 to the detector (not shown).

Figure 9:
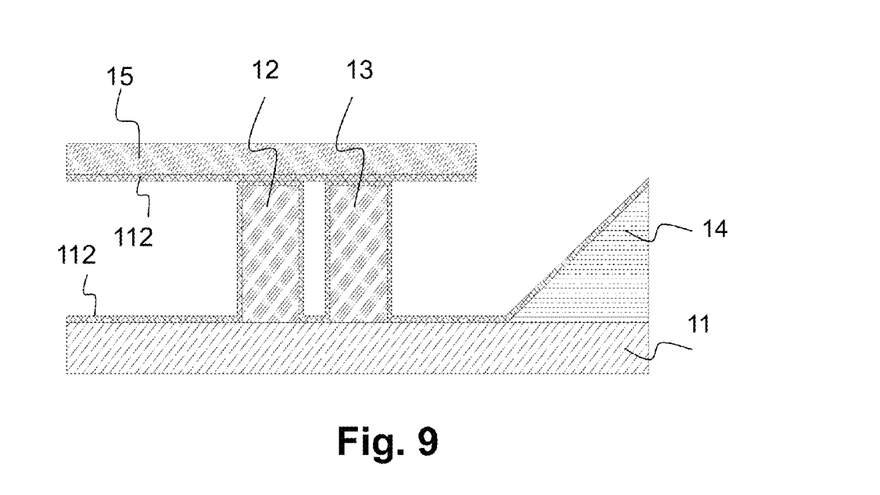

Moreover, not shown in FIG. 9, there are pluralities of first connecting units formed on the first substrate 11 for combining with second connecting units formed on the second substrate 15. By the combination of the first connecting units and the second connecting units, the structure steadiness of the optical wavelength dispersion device 10 is, therefore, improved.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An optical wavelength dispersion device, comprising:
a first substrate;
an input unit formed on the first substrate having a slit for receiving an optical signal;
a grating formed on the first substrate for producing a first light beam from the optical signal for outputting;
a second substrate covered on the top of the input unit and the grating; and
a photo-resist layer being developed to form the input unit and the grating when the photo-resist layer is exposed under a high energy light source exposure of a high energy light source which has a wavelength from 0.01 to 100 nm.

2. The optical wavelength dispersion device according to claim 1, further comprising a high-energy-light-source mask, wherein the photo-resist layer is exposed under the high energy light source through the high-energy-light-source mask, wherein the high energy light source is selected from a group consisting of X-ray, soft X-ray and EUV.

3. The optical wavelength dispersion device according to claim 1, wherein the width of the slit is from 5 to 500 μm, wherein the thickness of said photo-resist layer is from 10 um to 1000 um, wherein a space between the first substrate and the second substrate forms an optical waveguide therebetween for receiving and transmitting the optical signals.

4. The optical wavelength dispersion device according to claim 1, wherein the grating has a concave profile, wherein the grating has a surface roughness of 5 nm-10 nm and a plurality of peaks that a pitch between adjacent peaks of the grating is about 3 um.

5. The optical wavelength dispersion device according to claim 1, further comprising a plurality of first connecting units formed on the first substrate and a plurality of second connecting units formed on the second substrate, wherein said first connecting units are combined with the second connecting units to improve a structure steadiness thereof, wherein the first substrate and the second substrate are selected from a group consisting of semiconductor substrates, glass substrates, metal substrates and plastic substrates.

6. The optical wavelength dispersion device according to claim 1, further comprising an optical reflector formed on the first substrate for reflecting the first light beam from the grating in a user's designated direction, wherein the photo-resist layer is also developed to form the optical reflector when the photo-resist layer is exposed under the high energy light source exposure of the high energy light source.

7. The optical wavelength dispersion device according to claim 6, further comprising a reflectivity coating layer coated on a surface of each of the input unit, the grating and the optical reflector.

* * * * *